(12) United States Patent
Holden et al.

(10) Patent No.: US 10,692,765 B2
(45) Date of Patent: Jun. 23, 2020

(54) TRANSFER ARM FOR FILM FRAME SUBSTRATE HANDLING DURING PLASMA SINGULATION OF WAFERS

(71) Applicant: APPLIED MATERIALS, INC., Santa Clara, CA (US)

(72) Inventors: James M. Holden, San Jose, CA (US); Alexander N. Lerner, San Jose, CA (US); Ajay Kumar, Cupertino, CA (US); Brad Eaton, Menlo Park, CA (US); Aparna Iyer, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 14/536,318

(22) Filed: Nov. 7, 2014

(65) Prior Publication Data
US 2016/0133519 A1    May 12, 2016

(51) Int. Cl.
*H01L 21/687* (2006.01)
*H01L 21/683* (2006.01)
(Continued)

(52) U.S. Cl.
CPC ........ *H01L 21/78* (2013.01); *H01J 37/32715* (2013.01); *H01L 21/3065* (2013.01);
(Continued)

(58) Field of Classification Search
CPC ............... H01J 37/32743; H01L 21/78; H01L 21/3065; H01L 21/67109;
(Continued)

(56) References Cited

U.S. PATENT DOCUMENTS 4,049,944 A    9/1977   Garvin et al.
4,339,528 A    7/1982   Goldman
(Continued)

FOREIGN PATENT DOCUMENTS

JP    9216085    8/1997
JP    10321908   12/1998
(Continued)

OTHER PUBLICATIONS

Linder, V. et al., "Water-Soluble Sacrificial Layers for Surface Micromachining," www.small-journal.com, 2005, 1, No. 7, 7 pgs.
(Continued)

*Primary Examiner* — Yu Chen
(74) *Attorney, Agent, or Firm* — Schwabe, Williamson & Wyatt, P.C.

(57) ABSTRACT

Methods of and apparatuses for dicing semiconductor wafers, each wafer having a plurality of integrated circuits, are described. In an example, a plasma etch apparatus includes a plasma etch chamber. The plasma etch chamber includes a plasma source disposed in an upper region of the plasma etch chamber, a cathode assembly disposed below the plasma source, and a support pedestal for supporting a substrate carrier below the plasma source. The plasma etch apparatus also includes a transfer chamber coupled to the plasma etch chamber. The transfer chamber includes a transfer arm for supporting a substantial portion of a dicing tape of the substrate carrier, the transfer arm configured to transfer a sample from the support pedestal following an etch singulation process.

5 Claims, 10 Drawing Sheets

(51) Int. Cl.
  *H01L 21/677* (2006.01)
  *H01L 21/78* (2006.01)
  *H01L 21/311* (2006.01)
  *H01L 21/3065* (2006.01)
  *H01L 21/67* (2006.01)
  *H01J 37/32* (2006.01)
  *H01L 21/3213* (2006.01)
  *H01L 21/308* (2006.01)

(52) U.S. Cl.
  CPC .... *H01L 21/3081* (2013.01); *H01L 21/31105* (2013.01); *H01L 21/31127* (2013.01); *H01L 21/32131* (2013.01); *H01L 21/67109* (2013.01); *H01L 21/67207* (2013.01); *H01L 21/67742* (2013.01); *H01L 21/67748* (2013.01); *H01L 21/6836* (2013.01); *H01L 21/68707* (2013.01); *H01L 2221/68327* (2013.01)

(58) Field of Classification Search
  CPC ... H01L 21/67739–6776; H01L 21/677; H01L 21/67742; H01L 21/67748; H01L 21/67751; H01L 21/68707; H01L 21/6732; H01L 21/67326; F25B 21/02; F25B 21/04; C30B 35/005; B25J 15/009; B25J 15/0019; B25J 15/0033
  USPC ..................... 438/462, 464; 62/3.3
  See application file for complete search history.

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,499,777 B1 * | 12/2002 | Wang .................. C30B 35/005 | 118/728 |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 2001/0008172 A1 * | 7/2001 | Shoda ................ H01L 21/67109 | 156/345.53 |
| 2003/0045128 A1 * | 3/2003 | Tobashi .............. C23C 16/4583 | 438/784 |
| 2003/0162313 A1 | 8/2003 | Kim et al. | |
| 2003/0209014 A1 * | 11/2003 | Chang .................... F25B 21/04 | 62/3.3 |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2005/0111956 A1 * | 5/2005 | van der Meulen ...... B25J 9/042 | 414/744.2 |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2009/0255911 A1 | 10/2009 | Krishnaswami et al. | |
| 2010/0013036 A1 | 1/2010 | Carey | |
| 2010/0048001 A1 * | 2/2010 | Harikai ............. H01J 37/32743 | 438/464 |
| 2010/0192992 A1 * | 8/2010 | Toshima ........... H01L 21/67034 | 134/133 |
| 2010/0248451 A1 | 9/2010 | Pirogovsky et al. | |
| 2011/0312157 A1 * | 12/2011 | Lei .......................... H01L 21/78 | 438/462 |
| 2012/0064727 A1 * | 3/2012 | Oh ..................... H01L 21/02057 | 438/745 |
| 2012/0238073 A1 * | 9/2012 | Johnson .............. H01L 21/3065 | 438/464 |
| 2013/0045554 A1 | 2/2013 | Yamazaki | |
| 2013/0062013 A1 * | 3/2013 | Okada ............... H01L 21/67092 | 156/322 |
| 2013/0065378 A1 | 3/2013 | Johnson et al. | |
| 2013/0230972 A1 | 9/2013 | Johnson et al. | |
| 2016/0035601 A1 * | 2/2016 | Eum ................. H01L 21/67109 | 432/9 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

* cited by examiner

TRANSFER ARM FOR FILM FRAME SUBSTRATE HANDLING DURING PLASMA SINGULATION OF WAFERS

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, fifty to one hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits involves providing the semiconductor wafer on a substrate carrier, the substrate carrier having a dicing tape supporting the semiconductor wafer and a tape frame disposed above and surrounding the dicing tape. The method also involves providing a patterned mask above the semiconductor wafer, the patterned mask covering and protecting the integrated circuits and exposing regions of the semiconductor wafer between the integrated circuits. The method also involves transferring the substrate carrier having the semiconductor wafer thereon to a processing region of an etch chamber. The method also involves plasma etching the semiconductor wafer through the gaps in the patterned mask to singulate the integrated circuits. The method also involves transferring the substrate carrier having the singulated integrated circuits thereon from the processing region of the etch chamber using a transfer arm that supports a substantial portion of the dicing tape of the substrate carrier.

In another embodiment, a plasma etch apparatus includes a plasma etch chamber. The plasma etch chamber includes a plasma source disposed in an upper region of the plasma etch chamber, a cathode assembly disposed below the plasma source, and a support pedestal for supporting a substrate carrier below the plasma source. The plasma etch apparatus also includes a transfer chamber coupled to the plasma etch chamber. The transfer chamber includes a transfer arm for supporting a substantial portion of a dicing tape of the substrate carrier, the transfer arm configured to transfer a sample from the support pedestal following an etch singulation process.

In another embodiment, a method of dicing a semiconductor wafer having a plurality of integrated circuits involves forming a mask above the semiconductor wafer, the mask including a layer covering and protecting the integrated circuits. The method also involves patterning the mask with a laser scribing process to provide a patterned mask with gaps, exposing regions of the semiconductor wafer between the integrated circuits. The method also involves loading the semiconductor wafer on a substrate carrier, the substrate carrier having a dicing tape supporting the semiconductor wafer and a tape frame disposed above and surrounding the dicing tape. The method also involves transferring the substrate carrier having the semiconductor wafer thereon to a processing region of an etch chamber. The method also involves plasma etching the semiconductor wafer through the gaps in the patterned mask to singulate the integrated circuits. The method also involves transferring the substrate carrier having the singulated integrated circuits thereon from the processing region of the etch chamber using a transfer arm that supports a substantial portion of the dicing tape of the substrate carrier.

DETAILED DESCRIPTION

Methods of and apparatuses for dicing semiconductor wafers, each wafer having a plurality of integrated circuits thereon, are described. In the following description, numerous specific details are set forth, such as transfer arms for substrate carriers supporting thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to dicing tape integrity and, possibly, thermal management via dicing tape support during transfer following a plasma dicing singulation process. One or more embodiments are directed to a plasma etching die singulation process or a hybrid laser scribing and plasma etching die singulation process.

In an embodiment, a transfer arm is disclosed for film frame substrate handling during and, more particularly, subsequent to plasma singulation of wafers. To provide context, during or subsequent to plasma dicing of a wafer mounted on a tape frame, thermal management against dicing tape thermal damage or degradation can be critical to ensure successful plasma etch processing. Over-heating during plasma processing may lead to dicing tape cracking, burning or distortion, or lead to other issues such as adhesion degradation between the dicing tape and supporting frame. Such issues can result in failure of the etch process or catastrophic wafer damage. Furthermore, even if the dicing tape is maintained as whole, the integrity of the tape may be reduced. Post dicing transportation of a substrate carrier supporting singulated dies may thus prove problematic. One or more embodiments described herein address thermal management by providing suitable for transfer arm support of singulated dies on a dicing tape post singulation. In some embodiments, a supporting transfer arm is further equipped to remove a heat load from the dicing or carrier tape of a substrate carrier during post etching transfer.

Figure 1A:
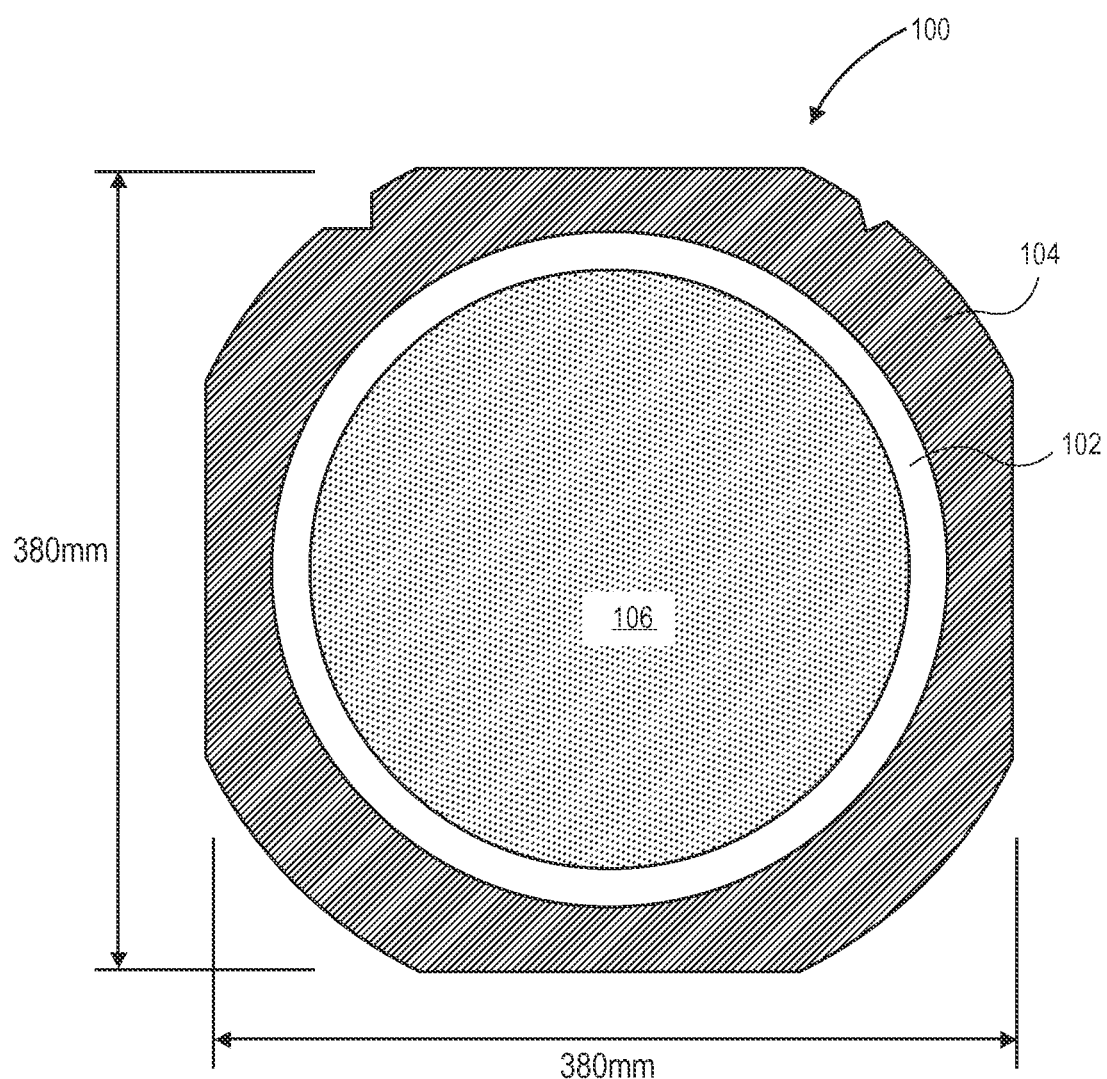
FIG. 1A illustrates a top plan view of a semiconductor wafer to be diced on a substrate carrier.

More generally, a substrate for dicing may be supported by a substrate carrier during at least the plasma etching portion of a die singulation process, e.g., of a hybrid laser ablation and plasma etching or a plasma only singulation scheme. For example, FIG. 1A illustrates a top plan view of a semiconductor wafer to be diced on a substrate carrier. Referring to FIG. 1A, a substrate carrier 100 includes a layer of backing tape 102 surrounded by a tape ring or frame 104. A wafer or substrate 106 is supported by the backing tape 102 of the substrate carrier 100. The wafer or substrate 106 may be attached to the backing tape 102 by a die attach film. The tape ring 104 may be composed of stainless steel.

Figure 1B:
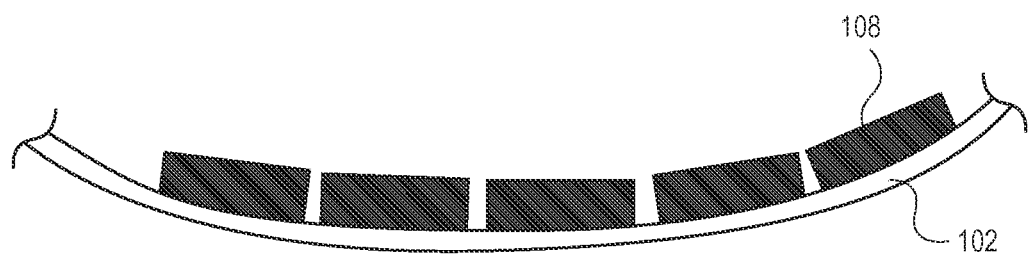
FIG. 1B illustrates a cross-sectional view of a diced semiconductor wafer on an unsupported substrate carrier.

FIG. 1B illustrates a cross-sectional view of a diced semiconductor wafer on an unsupported substrate carrier. Referring to FIG. 1B, the substrate 106 of FIG. 1A has been singulated to provide individual integrated circuit dies 108. As part of the singulation operation, the dicing tape 102 may lose some of its integrity during plasma processing. As such, as depicted in FIG. 1B, since the integrity of the substrate is lost due to singulation and since the dicing tape integrity may be compromised, the dicing tape supporting the singulated dies may sag upon transfer from the etch chamber used for singulation. A potential detriment of the sagging dicing tape can occur if die corners touch and/or the tape permanently deforms which can lead to fails at die pick.

With reference again to FIG. 1B, subsequent to plasma dicing of a thinned silicon wafer attached to a dicing frame by a dicing tape, a non-supporting transfer arm may be used to transport the singulated dies as still attached to the dicing tape. Since the tape may have been subjected to conditions that reduce the strength of the assembly, and since the dicing of the thin wafers may result in a weakening of the assembly, the individual dies attached to the tape may sag and result in damage to the singulated dies.

Turning now to FIGS. 2 and 3A-3C, in accordance with one or more embodiments of the present invention, a transfer arm that supports a diced wafer on the tape is implemented for at least post etch transfer such that that the sagging of the dicing tape described in association with FIG. 1B is otherwise not permitted. In one such embodiment, the supporting transfer arm substantially supports the area of the tape where the singulated dies reside. In some embodiments, the supporting transfer arm is actively or passively cooled to accommodate detrimental effects of heating of the dicing tape during etch processing.

Figure 2:
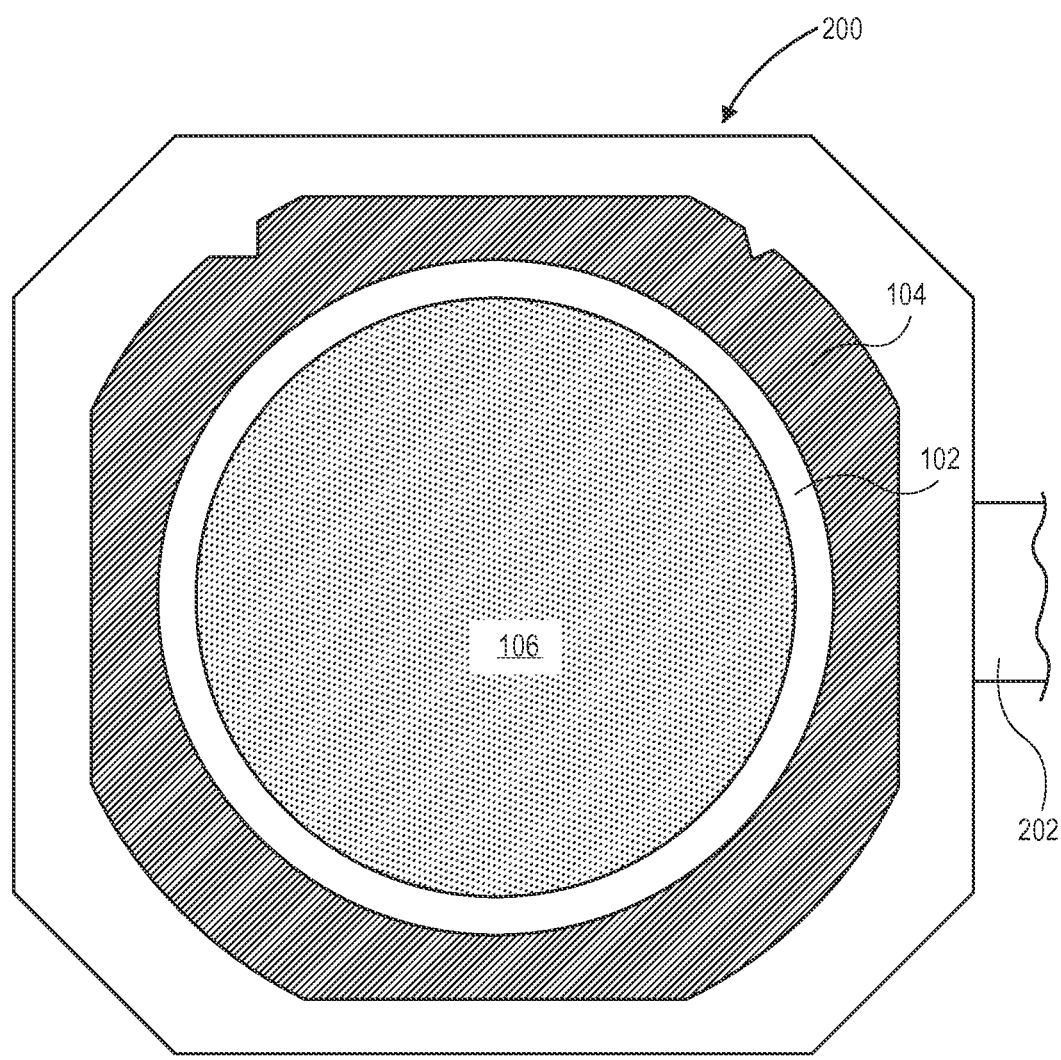
FIG. 2 illustrates a top plan view of a semiconductor wafer to be diced or that has been diced on a substrate carrier supported by a transfer arm, in accordance with an embodiment of the present invention.

FIG. 2 illustrates a top plan view of a semiconductor wafer to be diced or that has been diced on a substrate carrier supported by a transfer arm, in accordance with an embodiment of the present invention. Referring to FIG. 2, the substrate carrier of FIG. 1A is depicted. The substrate carrier 100 includes a layer of backing tape 102 surrounded by a tape ring or frame 104. A wafer or substrate 106 is supported by the backing tape 102 of the substrate carrier 100. With reference again to FIG. 2, a transfer arm 202 with a supporting portion 200 is provided for transfer of the substrate carrier 100. As depicted and described in association with FIGS. 3A-3C, the support region 200 may have a raised perimeter to act as barrier to carrier slippage during transfer.

Referring again to FIG. 2, the transfer arm, and particularly the supporting portion 200 of the transfer arm 202, is for supporting a substantial portion of the dicing tape 102 of the substrate carrier 102/104 from below the dicing tape 102. In an embodiment, the transfer arm 202 is configured to transfer a sample from a cathode assembly following an etch singulation process. In an embodiment, the supporting portion 200 of the transfer arm 202 directly supports greater than 80% of the surface area of dicing tape 102. In some embodiments, apertures such as transfer holes and/or cooling channels are formed through or in the surface of the supporting portion 200 of the transfer arm 202 and, thus, not all of the dicing tape 102 is in direct contact with the supporting portion 200 of the transfer arm 202. However, in other embodiments, all of the dicing tape 102 is in direct contact with the supporting portion 200 of the transfer arm 202.

In an embodiment, at least the supporting portion 200 of the transfer arm 202 is a stainless steel transfer arm. In other embodiments, at least the supporting portion 200 of the transfer arm 202 is composed of a non-conductive material. In an embodiment, the supporting portion 200 of the transfer arm 200 is composed of a conductive material, while the arm portion of transfer arm 202 is composed substantially of, or is coated by, a non-conductive material. In an embodiment, the transfer arm 202 is coupled to a transfer robot housed in a transfer chamber coupled to an etch chamber. It is to be appreciated that only a portion of the arm of transfer arm 202 is depicted in FIG. 2 (with the wavy break line indicating that the arm can extend well beyond the supporting portion 200).

Figure 3A:
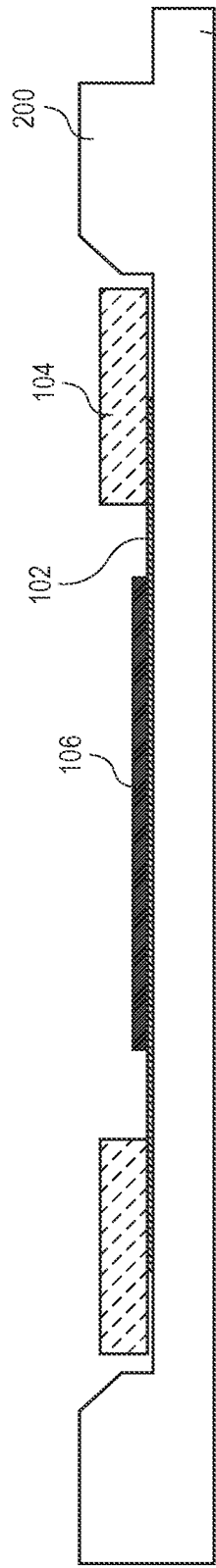
FIG. 3A illustrates a cross-sectional view of a semiconductor wafer to be diced or that has been diced on a substrate carrier supported by a transfer arm, in accordance with an embodiment of the present invention.

FIG. 3A illustrates a cross-sectional view of a semiconductor wafer to be diced or that has been diced on a substrate carrier supported by a transfer arm, in accordance with an embodiment of the present invention. Referring to FIG. 3A, a central cross-sectional view of the assembly of FIG. 2 is depicted. The support arm 202 having support portion 200 below a substrate carrier can be seen from this view. The substrate carrier includes the frame 104, tape 102, and supported wafer or substrate 106. Also seen from this perspective, a substantial amount, if not all, of the bottom surface of the dicing tape 102 of the substrate carrier is supported by the support portion 200 of the supporting arm 202. Also seen from this perspective, a perimeter of the support portion 200 may be raised to provide a cavity for the substrate carrier, such that the substrate carrier does not fall from the support portion 200 during transfer or movement of the support arm 202.

In an embodiment, as described above, at least the support portion 202 of the support arm 200 of FIG. 3A may be a passively cooled support portion 200. In an exemplary embodiment, prior to supporting a substrate carrier, the support portion 200 of the support arm 202 may be contacted to a cooled chamber wall of an associated etch chamber. In other embodiments, however, at least the support portion 202 of the support arm 200 may be an actively cooled support portion 200, examples of which are described in association with FIGS. 3B and 3C. In any case, a cooled support arm may be used to cool a dicing tape (and possibly a supporting tape frame), a supported wafer, or both.

Figure 3B:
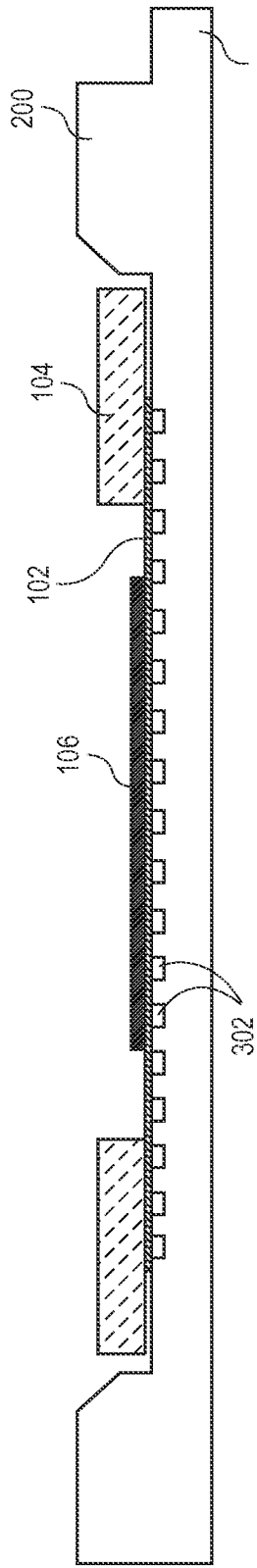
FIG. 3B illustrates a cross-sectional view of a semiconductor wafer to be diced or that has been diced on a substrate carrier supported by an actively-cooled transfer arm, in accordance with an embodiment of the present invention.

In a first example, FIG. 3B illustrates a cross-sectional view of a semiconductor wafer to be diced or that has been diced on a substrate carrier supported by an actively-cooled transfer arm, in accordance with an embodiment of the present invention.

Referring to FIG. 3B, the substrate carrier and transfer arm assembly described in association with FIG. 3A is depicted. However, additionally, at least the support portion 200 of the transfer arm 202 is an actively-cooled support portion that includes grooves 302 formed in a supporting surface of the support portion 200 of the transfer arm 200. In one such embodiment, the grooves 302 are for flowing a cooling gas therein, such as a helium cooling gas. The cooling gas can transfer away heat otherwise remaining in the dicing tape 102 following an etch process. Additionally, the cooling grooves can be used to cool a dicing tape prior to an etch process.

Figure 3C:
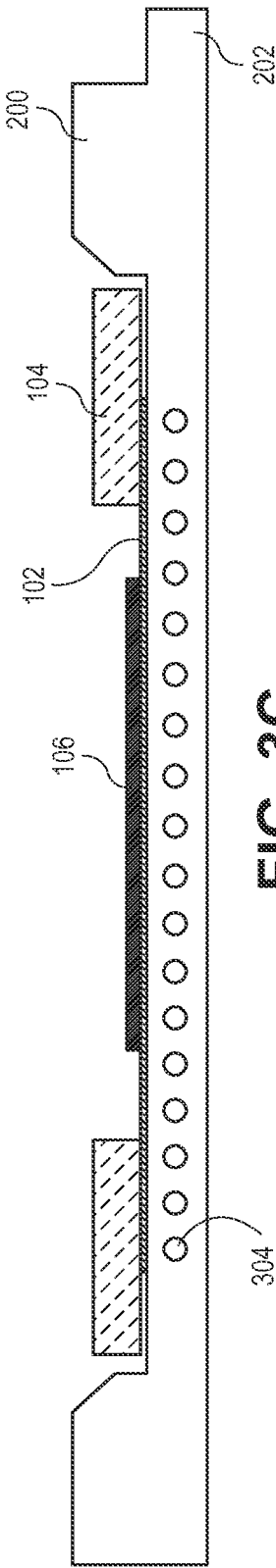
FIG. 3C illustrates a cross-sectional view of a semiconductor wafer to be diced or that has been diced on a substrate carrier supported by another actively-cooled transfer arm, in accordance with another embodiment of the present invention.

In a second example, FIG. 3C illustrates a cross-sectional view of a semiconductor wafer to be diced or that has been diced on a substrate carrier supported by another actively-cooled transfer arm, in accordance with another embodiment of the present invention.

Referring to FIG. 3C, the substrate carrier and transfer arm assembly described in associated with FIG. 3A is depicted. However, additionally, at least the support portion 200 of the transfer arm 202 is an actively-cooled support portion that includes internal channel 304 formed in the body of the support portion 200 of the transfer arm 200. In one such embodiment, the internal channels 304 are for flowing a cooling fluid there through. The channels 304 may have one or more entrance openings and one or more exit openings and may form a pattern within the body of the support portion 200 (e.g., under the tape support region of the transfer arm 200) for cooling the region below the tape 102. The cooling fluid circulated through the channels 304 can transfer away hear otherwise remaining in the dicing tape 102 following an etch process. Additionally, the cooling channels can be used to cool a dicing tape prior to an etch process.

In an embodiment, the internal channels 304 are part of a heat transfer fluid loop thermally coupled to a heat sink (e.g., a chiller) to remove heat from the supporting portion 200 of the transfer arm 202. A heat transfer liquid or gas (i.e., a cooling fluid or gas) may be used to circulate through the heat transfer fluid loop, including through the internal channels 304. The heat transfer liquid may be any employed in the art, for example an anti-freeze or a perfluoropolyether known under the trade names of Fluorinert (3M, Inc.) or Galden (Solvey Solexis, Inc), e.g., Galden HT135 for operation in the range of 0° C.-20° C.

Advantages of a supporting transfer arm may include a more reliable etch process for die singulation and, in particular, a more robust post singulation transfer process. It is to be appreciated that industry-first wafer die singulation inside a plasma etch chamber faces many challenges. For example, a tape frame wafer carrier is not necessarily designed for a vacuum chamber or to accommodate the heat generated by plasma etching which can burn or make rigid the sticky flexible tape normally included within the tape frame. Burned and/or rigid tape frame tape resulting from processing in a plasma etch chamber can lead to a total loss of the entire completed wafer. Accordingly, one of the issues being faced at present the potential need to maintain cooling of the frame ring and flexible sticky tape while, or subsequent to, the wafer is/was heated by a plasma etch process.

One or more embodiments described herein may address loss of dicing tape integrity following an etch process by supporting a weakened dicing tape during transfer out of an etch chamber. One or more embodiments may address removal of residual head from a dicing tape by using a passively or actively cooled supporting transfer arm during transfer of a substrate carrier out of an etch chamber post die singulation.

In another aspect, prior to transferring a substrate carrier having singulated dies thereon with a supporting transfer arm, a cooled etch process may be used to ensure that the dicing tape does not substantially or detrimentally over heat during etch singulation. In one such case, a cooling pedestal may be used. As an exemplary implementation of a cooling pedestal, FIG. 4 illustrates a cathode assembly for a plasma processing chamber, the cathode assembly including a cooling pedestal, in accordance with an embodiment of the present invention.

Figure 4:
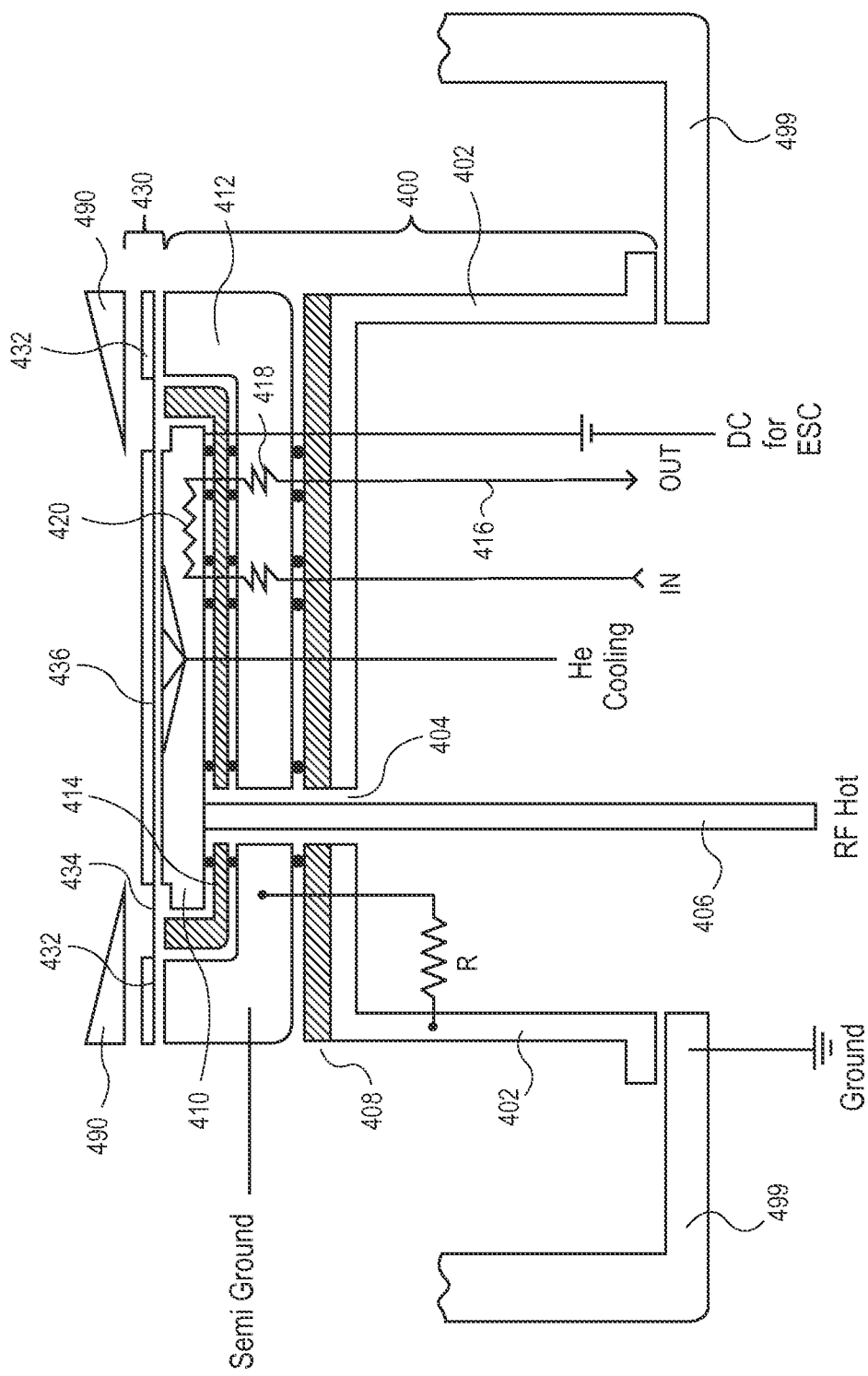
FIG. 4 illustrates a cathode assembly for a plasma processing chamber, the cathode assembly including a cooling pedestal, in accordance with an embodiment of the present invention.

Referring to FIG. 4, a cathode assembly 400 includes a cathode base 402. The cathode base 402 is an isolated base that is conductive and grounded (i.e., coupled to ground, as depicted in FIG. 4). In one embodiment, the cathode base 402 is not coupled to radio frequency (RF) power, but has an opening 404 for an RF rod 406 (which may be RF hot) to pass there through. The resulting assembly may be referred to as a split cathode assembly. In an embodiment, the cathode assembly 400 is housed in a chamber body 499 (a portion of which is shown), such as a chamber body of a plasma processing chamber.

An insulator 408 separates the cathode base 402 from an RF-powered chuck 410 (e.g., RF power supplied as high frequency AC from RF rod 406). In one embodiment, the RF-powered chuck 410 is an electrostatic chuck (ESC) dielectric pedestal (which may be a high voltage DC pedestal, as depicted in FIG. 4). In an embodiment, the RF-powered chuck 410 includes cooling channels on a substrate supporting surface thereof, such as helium (He) cooling channels thereon, an indication of which is labeled generically in FIG. 4.

An RF-isolated support 412 surrounds but is isolated from the RF-powered chuck 410. In one embodiment, the RF-isolated support 412 is not coupled to an RF source, either directly or indirectly. In one embodiment, the RF-isolated support 412 is isolated from the RF-powered chuck 410 by insulator 414. In one embodiment, the RF-isolated support 412 is composed of aluminum and is conductive. In an embodiment, the RF-isolated support 412 is a cooling ring and is grounded (e.g., to semi ground) so that plasma is not generated from its surface during a plasma processing operation. In one embodiment, the RF-isolated support 412 is also isolated from the cathode base 402 by the insulator 408 and, thus, a resistive path (R) is between the RF-isolated support 412 and the cathode base 402, as is depicted in FIG. 4.

In an embodiment, the RF-isolated support 412 and the RF-powered chuck 410 are together sized to accommodate a substrate carrier 430. For example, in one embodiment, the substrate carrier 430 has frame 432 and tape (which may have exposed portions 434) and a substrate supporting region for supporting a substrate 436. In a particular embodiment, as depicted in FIG. 4, the RF-isolated support 412 is sized to accommodate substantially all of the frame 432 portion of the substrate carrier 430, while the RF-powered chuck 410 is sized to accommodate substantially all of the substrate supporting region of the substrate carrier 430.

However, it is to be appreciated that variations in relative supporting regions of the RF-isolated support 412 and the RF-powered chuck 410 may be suitable for applications described herein, e.g., the RF-isolated support 412 may further contact a portion of the exposed tape 434 in addition to contacting the carrier frame 432. In a particular embodiment, the cathode assembly 400 including the RF-isolated support 412 and the RF-powered chuck 410 can be referred to as a cooling pedestal that provides RF isolation for a tape frame supporting a 300 mm wafer in a dual plasma system (DPS).

The cathode assembly 400 includes a heat transfer fluid loop 416. The heat transfer fluid loop 416 includes channels 418 in the RF-isolated support 412 and channels 420 in the RF-powered chuck 410 (only illustrative channels shown in FIG. 4). Accordingly, in one embodiment, both the RF-isolated support 412 and the RF-powered chuck 410 are liquid cooled. In an embodiment, as depicted, the heat transfer fluid loop 416 transfers coolant in series through the RF-isolated support 412 and the RF-powered chuck 410. Even so, in one such embodiment, a non-conductive cooling fluid is used in order to maintain isolation between the RF-isolated support 412 and the RF-powered chuck 410 (i.e., the RF-isolated support 412 remains RF-free even through a common heat transfer fluid loop 416 is used. In an embodiment, the heat transfer fluid loop 416 is thermally coupled to a heat sink (e.g., a chiller) to remove heat from the RF-isolated support 412 and the RF-powered chuck 410. The heat transfer liquid may be any employed in the art, for example an anti-freeze or a perfluoropolyether known under the trade names of Fluorinert (3M, Inc.) or Galden (Solvey Solexis, Inc), e.g., Galden HT135 for operation in the range of 0° C.-20° C. In one embodiment, then, the RF-powered chuck 410 is a cooling RF-powered chuck, the RF-isolated support 412 is a cooling RF-isolated support, and both the cooling RF-powered chuck and the cooling RF-isolated support are configured to be maintained at a temperature below 0 degrees Celsius during plasma processing.

In one particular embodiment, the heat transfer fluid loop 416 of the cooling pedestal described in association with FIG. 4 is further in series with the internal cooling channels 304 of the transfer arm described in association with FIG. 3C. In that embodiment, the heat transfer fluid loop 416 is thermally coupled to a heat sink (e.g., a chiller) to remove heat from the transfer arm 200 of FIG. 3C and cooling pedestal.

Referring again to FIG. 4, a shadow ring 490 may be implemented in conjunction with the cathode assembly 400. In an embodiment, the shadow ring 490 is disposed over a stainless steel frame ring 432 and a portion of the exposed tape 434. The shadow ring may be implemented to provide additional protection from plasma bombardment and also reduce byproduct deposition on the frame and tape from etch processes (e.g., byproducts from etch processes tend to stick to the colder surfaces within the chamber). In an embodiment, as described in greater detail below, a shadow ring or actively cooled shadow ring is implemented in conjunction with the cooling pedestal of FIG. 4.

Referring again to FIG. 4, then, the RF rod 406 is only connected to the RF-powered chuck 410. RF power is not transferred through the cooling fluid used in the heat transfer fluid loop 416. The tape frame 432 of a carrier 430 contacts the aluminum conductive pedestal (the RF-isolated support 412) without RF power and, as such, is only cooled by the cooling fluid. On the other hand, RF power is only concentrated within the wafer 436 zone to control the plasma for etching. In an embodiment, a top surface of the carrier 430 is further protected by a moveable shadow ring 490.

Perhaps more generally, it is to be appreciated that during plasma etching processes, the temperature of wafer is typically controlled by the electrostatic-chuck. The wafer shield ring acts as a thermal barrier to the frame and tape pairing. However, depending on the specific tape and etching process recipe (particularly process time) employed in a given application, the wafer shield ring may be not sufficient to block the heat from transfer to the frame and tape beneath it. In such a case, the tape and/or frame can become overheated as to either cause tape damage or delamination of tape from frame or reduction of adhesion between tape and frame. Such damage of tape between the frame and wafer can cause the failure of the etch process and lead to wafer damage. The delamination of tape from the frame is another critical dicing failure. The reduction of adhesion between tape and frame can, for example, cause tape to peel off from the frame during tape expansion operation used for die pick. In an embodiment, cooling of the tape and frame with the cooling pedestal of FIG. 4 is performed during etch processing in order to avoid potential tape damage/degradation.

In another aspect of the present invention, one or more embodiments described herein are directed to an actively-cooled shadow ring for heat dissipation in a plasma etch chamber. An exemplary actively-cooled shadow ring for heat dissipation in a plasma chamber, which may be used as described with, or may be modified to accommodate, a cooling pedestal, is now described in greater detail. In an embodiment, an actively-cooled shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of an actively-cooled shadow ring can provide other process benefits can include an increase in throughput. For example, temperature reduction may otherwise be achieved by easing of process conditions such as RF power reduction, but this requires an increase in process time which is detrimental to throughput.

Figure 5:
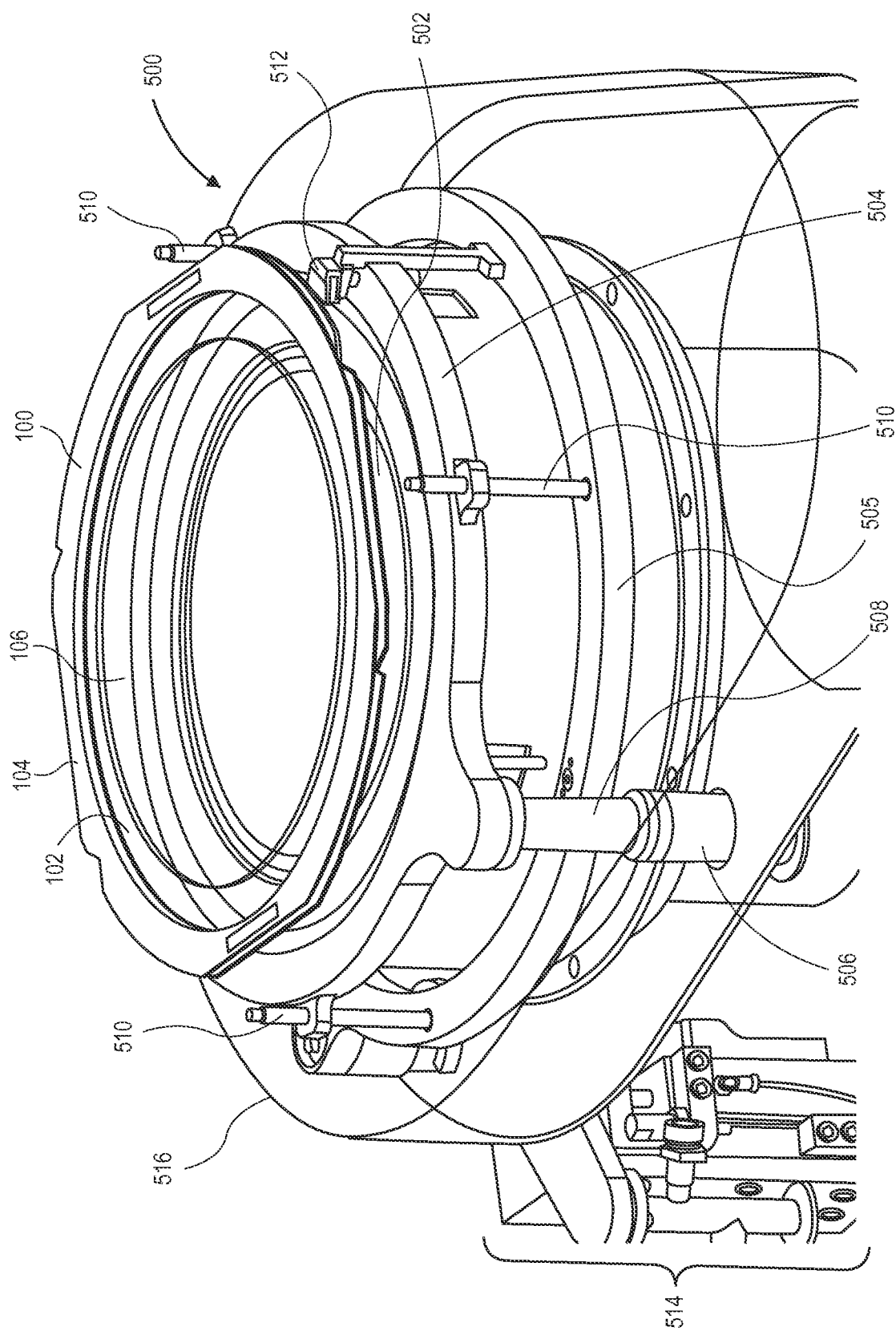
FIG. 5 illustrates an angled view of an actively-cooled shadow ring for heat dissipation in a plasma chamber with relative positioning to an etch cathode shown and relative sizing to a wafer support shown, in accordance with an embodiment of the present invention.

FIG. 5 illustrates an angled view of an actively-cooled shadow ring for heat dissipation in a plasma chamber with relative positioning to an etch cathode shown and relative sizing to a wafer carrier shown, in accordance with an embodiment of the present invention.

Referring to FIG. 5, a support apparatus 500 for a plasma chamber includes a cathode 502 positioned below an actively-cooled shadow ring 504. A wafer or substrate support 100 with a tape 102 and frame 104 and supporting a wafer or substrate 106 is shown above the actively-cooled shadow ring 504 for sizing perspective. Such a wafer or substrate support can be as described above with respect to FIG. 1. In use, the wafer or substrate support/carrier 100 is actually positioned between the actively-cooled shadow ring 504 and the cathode 502. The support apparatus 500 may also include a motorized assembly 514 and a casing 516, which is also depicted in FIG. 5. In an embodiment, the support cathode is or includes a cooling pedestal, such as the cooling pedestal described in association with FIG. 4.

Referring again to FIG. 5, the actively-cooled shadow ring 504 is fed with coolant gas or liquid by a bellows feed-through 506 which feeds into a plasma exposed coupler 508. In an embodiment, the actively-cooled shadow ring 504 is raised or lowered relative to a fixed cathode by three vertical posts 510 which can be raised for introduction of the substrate or wafer carrier 100 to the cathode 502 and then lowered to clamp the substrate or wafer carrier 100 into position. The three vertical posts 510 attach the actively-cooled shadow ring 504 to a circular ring 505 below. The circular ring 505 is connected to the motorized assembly 514 and provides the vertical motion and positioning of the actively-cooled shadow ring 504.

The substrate or wafer carrier 100 may rest on a plurality of pads that sit between the actively-cooled shadow ring 504 and the cathode 502. For illustrative purposes, one such pad 512 is depicted. However, it is to be appreciated that the pad 512 is actually below or underneath the actively-cooled shadow ring 504, and that more than one pad is typically used, such as four pads. In an embodiment, the actively-cooled shadow ring 504 is composed of aluminum with a hard anodized surface or a ceramic coating. In an embodiment, the actively-cooled shadow ring 504 is sized to entirely cover, from a top-down perspective, the tape frame 104, the tape 102, and the outer most region of the substrate 106 during plasma processing. In one specific such embodiment, the leading edge of the shadow ring to the wafer is approximately 0.050 inches high.

Although not depicted, a pair of fluid connections, such as a supply and return line pair, may be included as entering/exiting the actively-cooled shadow ring 504. In an embodiment, the pair of fluid connections provides an entrance/exit to an internal fluid channel that circulates through the actively-cooled shadow ring 504. In one such embodiment, the pair of fluid connections enables continual flow of a cooling fluid or gas through the actively-cooled shadow ring during plasma processing. In a specific embodiment, the cooling channels travel essentially the entire mid-circumference of the body of an annular actively-cooled shadow ring.

In an embodiment, the ability to enable such continual flow can provide superior temperature control of the shadow ring which enables temperature control (e.g., reduced temperature exposure) of the tape frame and tape of a substrate carrier clamped to the actively-cooled shadow ring 504. This protection of the tape frame and tape is in addition to the protection provided by physically blocking the plasma from reaching the tape frame and tape of the substrate or wafer carrier. The fluid-channeled shadow ring, referred to herein as actively-cooled shadow ring 504, is distinguished from passively cooled shadow rings that may merely be cooled by contact with a heat sink or a cooled chamber wall.

In one particular embodiment, the heat transfer fluid loop 416 of the cooling pedestal described in association with FIG. 4 is further in series with the internal fluid channel that circulates through the actively-cooled shadow ring 504. In that embodiment, the heat transfer fluid loop 516 is thermally coupled to a heat sink (e.g., a chiller) to remove heat from the RF-isolated support 412, the RF-powered chuck 410, and the actively-cooled shadow ring 504. In another or same embodiment, the internal cooling channels 304 of the transfer arm described in association with FIG. 3C are further in series with the internal fluid channel that circulates through the actively-cooled shadow ring 504. In that embodiment, the heat transfer fluid loop 516 is thermally coupled to a heat sink (e.g., a chiller) to remove heat from the transfer arm 200 of FIG. 3C and the actively-cooled shadow ring 504.

In an aspect of the present invention, an etch reactor is configured to accommodate etching of a thin wafer or substrate supported by a substrate carrier. For example, FIG. 6 illustrates a cross-sectional view of an etch reactor, in accordance with an embodiment of the present invention.

Figure 6:
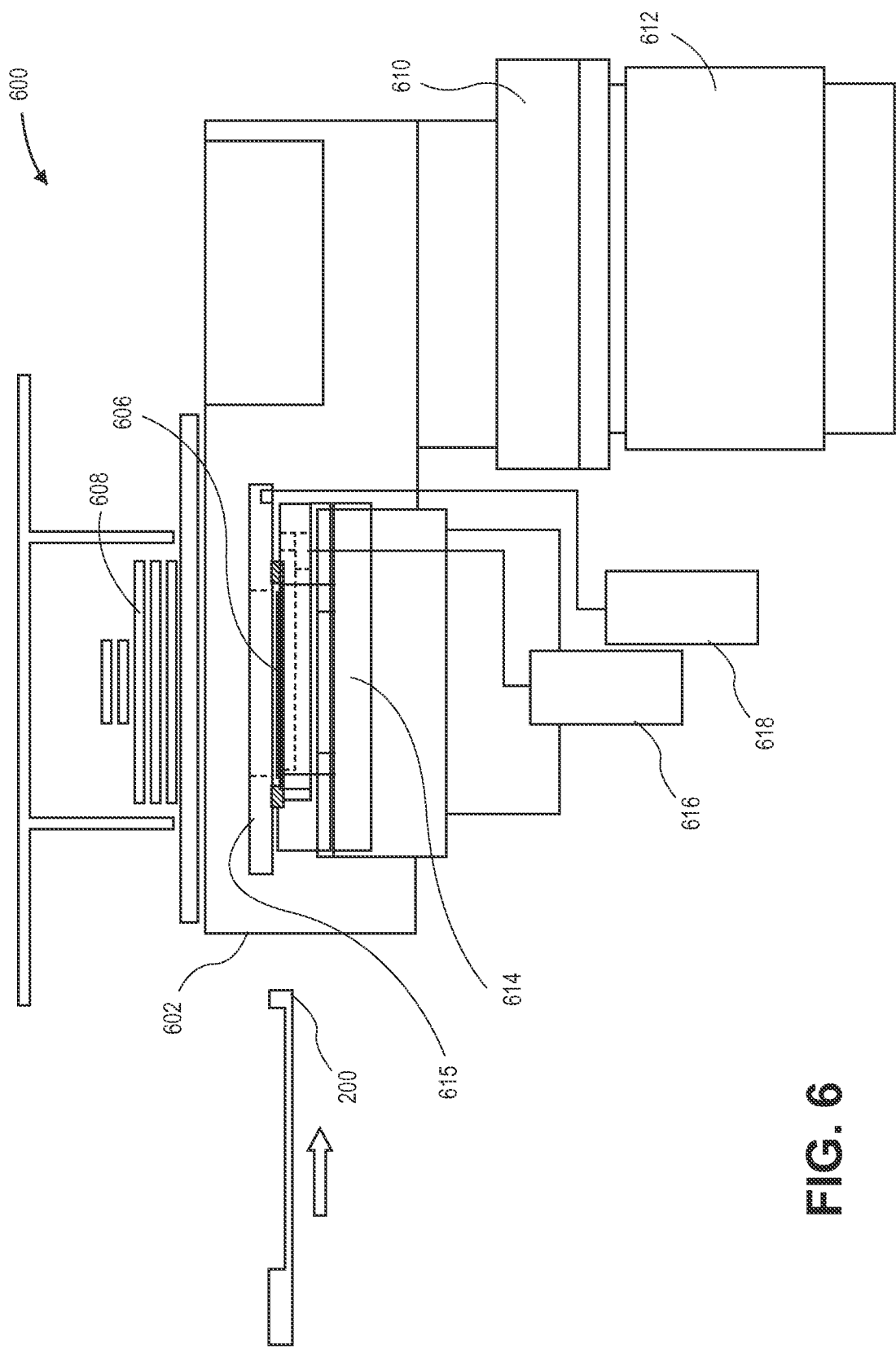
FIG. 6 illustrates a cross-sectional view of an etch reactor, in accordance with an embodiment of the present invention.

Referring to FIG. 6, an etch reactor 600 includes a chamber 602. A supporting transfer arm 200, such as one of the transfer arms described in association with FIGS. 3A-3C is included for transferring a substrate carrier 606 from (and possibly to) chamber 602. In one embodiment, the transfer arm also includes a feature to calibrate and center the transfer arm 200 with respect to circular features of a processing tool (e.g., an etch cathode center, or a center of a circular silicon wafer).

An inductively coupled plasma (ICP) source 608 is positioned in an upper portion of the chamber 602. The chamber 602 may be further equipped with a throttle valve 610 and a turbo molecular pump 612. The etch reactor 600 may also include a cathode assembly 614 (e.g., an assembly including an etch cathode or etch electrode). In one such embodiment, the cathode assembly 614 includes a cooling pedestal, such as the cooling pedestal described in association with FIG. 4.

A shadow ring assembly 615 is included above the region accommodating the substrate or wafer carrier 606. In an embodiment, the shadow ring assembly 615 is an actively-cooled shadow ring, such as described in association with FIG. 5. A shadow ring actuator 618 may be included for moving the shadow ring. In one such embodiment, the shadow ring actuator 618 moves a single lift hoop that is coupled to a tape frame lift and a shadow ring. Other actuators, such as actuator 616 may also be included.

In another aspect of the present disclosure, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment, the wafer or substrate is supported by a substrate carrier having a tape frame during the singulation process, including during the etch portion of the singulation process.

Figure 7:
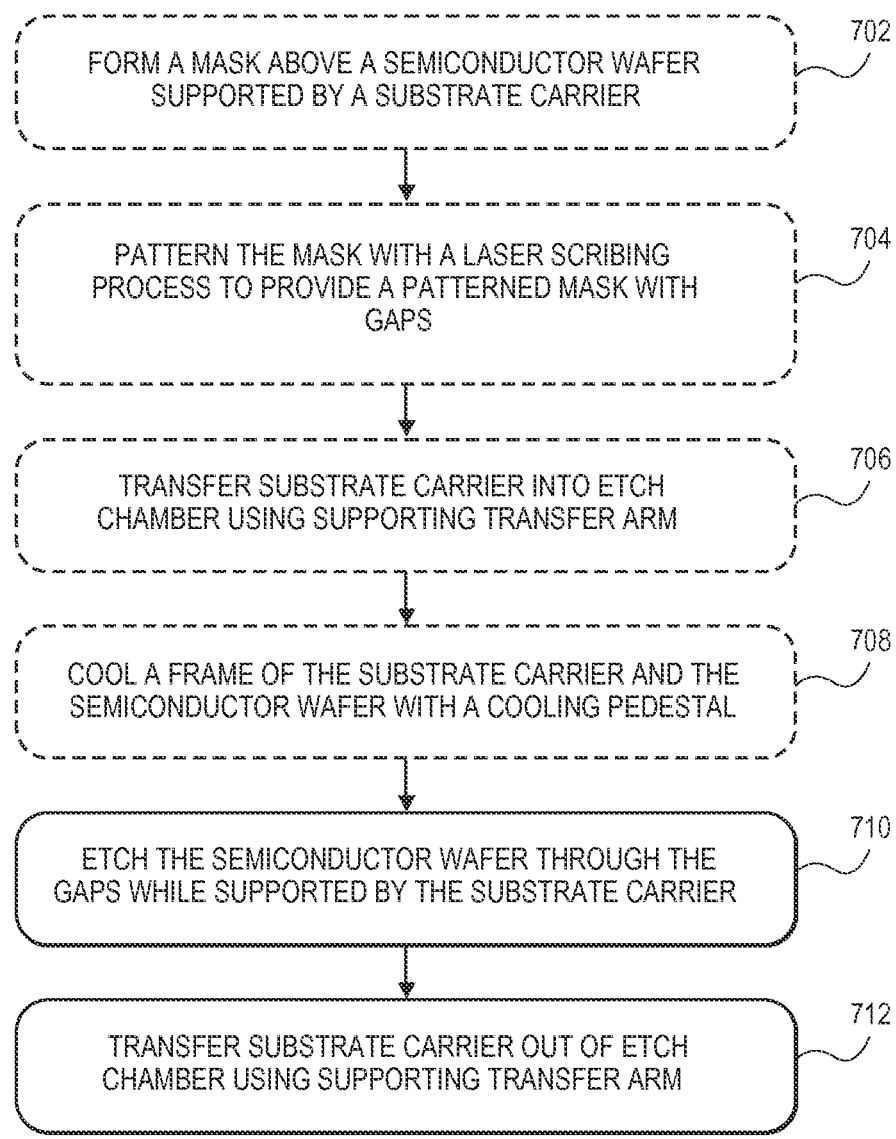
FIG. 7 is a Flowchart representing operations in a method of dicing a semiconductor wafer including a plurality of integrated circuits, in accordance with an embodiment of the present invention.
Figure 8A:
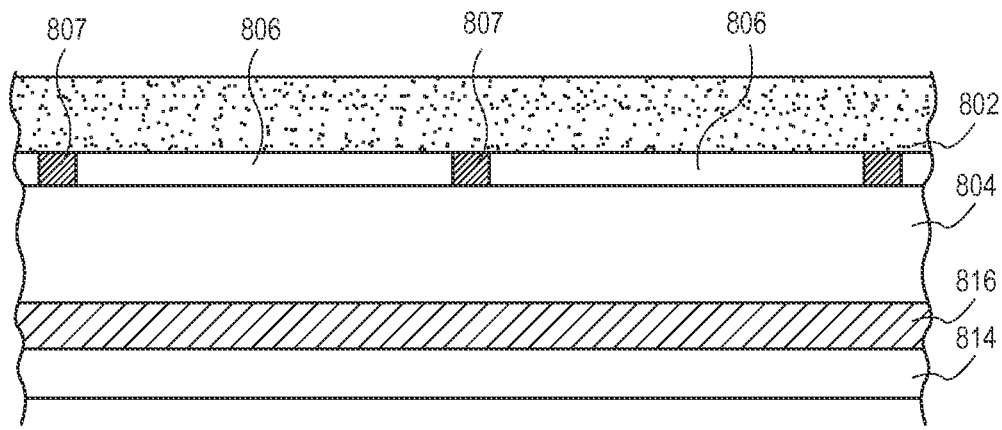
FIG. 8A illustrates a cross-sectional view of a semiconductor wafer including a plurality of integrated circuits during performing of a method of dicing the semiconductor wafer, corresponding to operation 702 of the Flowchart of FIG. 7, in accordance with an embodiment of the present invention.
Figure 8B:
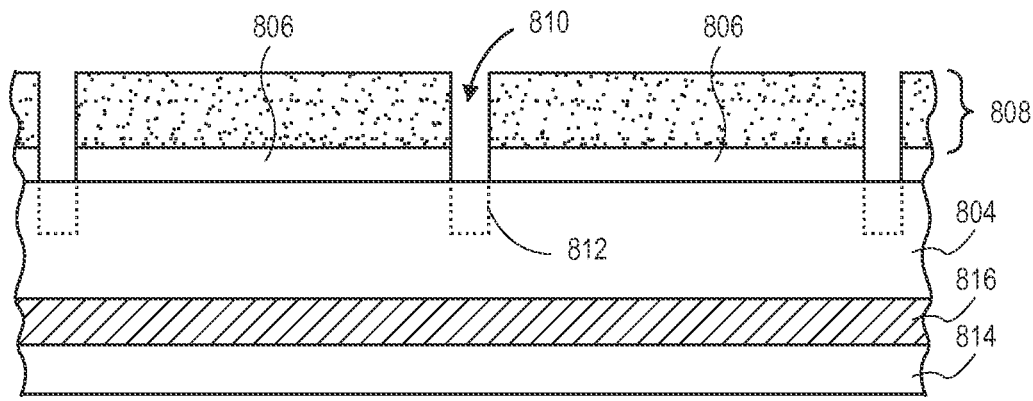
FIG. 8B illustrates a cross-sectional view of a semiconductor wafer including a plurality of integrated circuits during performing of a method of dicing the semiconductor wafer, corresponding to operation 704 of the Flowchart of FIG. 7, in accordance with an embodiment of the present invention.
Figure 8C:
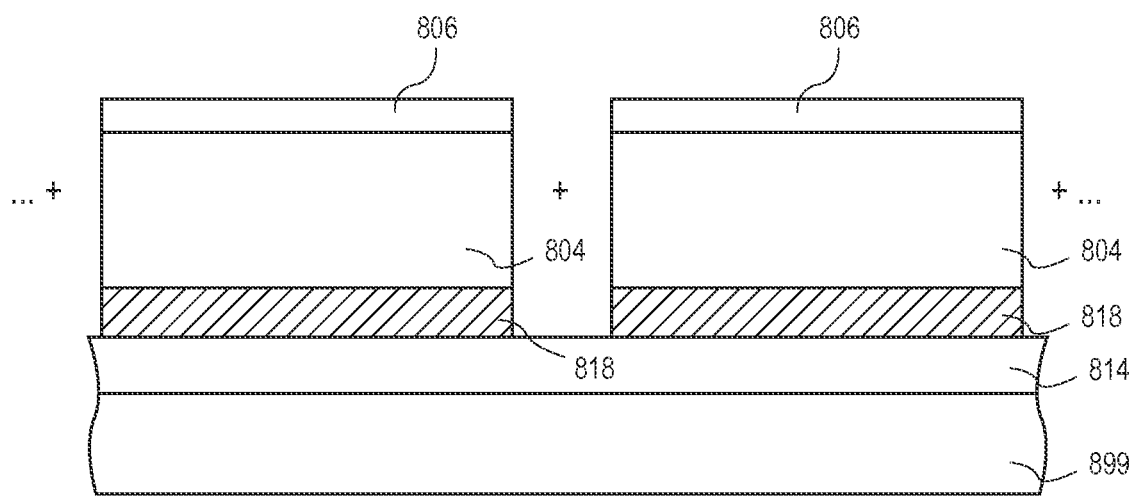
FIG. 8C illustrates a cross-sectional view of a semiconductor wafer including a plurality of integrated circuits during performing of a method of dicing the semiconductor wafer, corresponding to operation 710 of the Flowchart of FIG. 7, in accordance with an embodiment of the present invention.

In an example, FIG. 7 is a Flowchart 700 representing operations in a method of dicing a semiconductor wafer including a plurality of integrated circuits, in accordance with an embodiment of the present invention. FIGS. 8A-8C illustrate cross-sectional views of a semiconductor wafer including a plurality of integrated circuits during performing of a method of dicing the semiconductor wafer, corresponding to operations of Flowchart 700, in accordance with an embodiment of the present invention.

Referring to optional operation 702 of Flowchart 700, and corresponding FIG. 8A, a mask 802 is formed above a semiconductor wafer or substrate 804. The mask 802 is composed of a layer covering and protecting integrated circuits 806 formed on the surface of semiconductor wafer 804. The mask 802 also covers intervening streets 807 formed between each of the integrated circuits 806. The semiconductor wafer or substrate 804 is supported by a substrate carrier 814.

In an embodiment, the substrate carrier 814 includes a layer of backing tape, a portion of which is depicted as 814 in FIG. 8A, surrounded by a tape ring or frame (not shown). In one such embodiment, the semiconductor wafer or substrate 804 is disposed on a die attach film 816 disposed on the substrate carrier 814, as is also depicted in FIG. 8A.

In accordance with an embodiment of the present invention, forming the mask 802 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 802 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 802 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 804 is composed of a material suitable to withstand a fabrication process and upon which semiconductor processing layers may suitably be disposed. For example, in one embodiment, semiconductor wafer or substrate 804 is composed of a group IV-based material such as, but not limited to, crystalline silicon, germanium or silicon/germanium. In a specific embodiment, providing semiconductor wafer 804 includes providing a monocrystalline silicon substrate. In a particular embodiment, the monocrystalline silicon substrate is doped with impurity atoms. In another embodiment, semiconductor wafer or substrate 804 is composed of a material such as, e.g., a material substrate used in the fabrication of light emitting diodes (LEDs).

In an embodiment, the semiconductor wafer or substrate 804 has a thickness of approximately 300 microns or less. For example, in one embodiment, a bulk single-crystalline silicon substrate is thinned from the backside prior to being affixed to the die attach film 816. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 816 (or any suitable substitute capable of bonding a thinned or thin wafer or substrate to the substrate carrier 814) has a thickness of approximately 20 microns.

In an embodiment, the semiconductor wafer or substrate 804 has disposed thereon or therein, as a portion of the integrated circuits 806, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 806. Materials making up the streets 807 may be similar to or the same as those materials used to form the integrated circuits 806. For example, streets 807 may be composed of layers of dielectric materials, semiconductor materials, and metallization. In one embodiment, one or more of the streets 807 includes test devices similar to the actual devices of the integrated circuits 806.

Referring to optional operation 704 of Flowchart 700, and corresponding FIG. 8B, the mask 802 is patterned with a laser scribing process to provide a patterned mask 808 with gaps 810, exposing regions of the semiconductor wafer or substrate 804 between the integrated circuits 806. In one such embodiment, the laser scribing process is a femtosecond-based laser scribing process. The laser scribing process is used to remove the material of the streets 807 originally formed between the integrated circuits 806. In accordance with an embodiment of the present invention, patterning the mask 802 with the laser scribing process includes forming trenches 812 partially into the regions of the semiconductor wafer 804 between the integrated circuits 806, as is depicted in FIG. 8B.

In an embodiment, patterning the mask 802 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 802, the streets 807 and, possibly, a portion of the semiconductor wafer or substrate 804.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz.

In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to optional operation 706 of Flowchart 700, the substrate carrier 814 and supported semiconductor wafer or substrate 804 is transferred to an etch chamber using a supporting transfer arm. In one such embodiment, the transfer arm is the same arm as described below in association with operation 712. In an embodiment, the transfer arm is a cooling transfer arm, and may be used to reduce a temperature of the dicing tape and/or tape frame of a substrate carrier prior to etch processing.

Referring to optional operation 708 of Flowchart 700, the tape frame and the supported semiconductor wafer or substrate 804 of the substrate carrier 814 is supported by a cooling pedestal. In one such embodiment, a supporting transfer arm of optional operation 706 is used to transfer the supported semiconductor wafer or substrate 804 of the substrate carrier 814 to the cooling pedestal. In one such embodiment, a cooling pedestal as described above in association with FIG. 4 is used to support the tape frame and semiconductor wafer or substrate 804 of the substrate carrier 814 below a shadow mask. In one embodiment, the shadow mask is a low contact shadow mask. In one embodiment, the cooling is achieved from below the substrate and tape frame by flowing a coolant through both an RF-powered chuck and RF-isolated support of the cooling pedestal.

Referring again to operation 708, in accordance with an optional embodiment of the present invention, a portion of the substrate carrier 814 is covered with an actively-cooled shadow ring in preparation for an etch portion of the dicing process. In one embodiment, the actively-cooled shadow ring is included in a plasma etching chamber.

Referring to operation 710 of Flowchart 700, and corresponding FIG. 8C, the semiconductor wafer or substrate 804 is then etched through the gaps 810 in the patterned mask 808 to singulate the integrated circuits 806. In accordance with an embodiment of the present invention, etching the semiconductor wafer 804 includes etching to extend the trenches 812 formed with the laser scribing process and to ultimately etch entirely through semiconductor wafer or substrate 804, as depicted in FIG. 8C.

Referring to operation 712 of Flowchart 700, following etch singulation, the substrate carrier 814 and the supported now diced semiconductor wafer or substrate 804 (i.e., singulated dies of integrated circuits 106) are transferred out of the etch chamber using a supporting transfer arm (a portion of which is shown as 899 in FIG. 8C). The transfer arm may be a supporting transfer arm such as described in association with FIGS. 2 and 3A-3C. The transfer arm 899 supports the dicing tape 814 and supported dies 806 and, in an embodiment, prevents potentially dangerous sagging of a processed dicing tape 814.

In an embodiment, transferring the substrate carrier from the processing region of the etch chamber involves cooling the dicing tape by passively cooling the transfer arm. In another embodiment, transferring the substrate carrier from the processing region of the etch chamber involves cooling the dicing tape by actively cooling the transfer arm. In a specific such embodiment, the active cooling of the transfer arm involves flowing a cooling gas in grooves formed in a surface of the transfer arm, at least a portion of which supports the dicing tape. In another specific such embodiment, the active cooling of the transfer arm involves flowing a cooling fluid in internal channels of the transfer arm below the region where the dicing tape rests during carrier transfer.

In an embodiment, etching the semiconductor wafer or substrate 804 includes using a plasma etching process. In one embodiment, a through-silicon via type etch process is used. For example, in a specific embodiment, the etch rate of the material of semiconductor wafer or substrate 804 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 804 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 816. In one embodiment, die attach film 816 is patterned by a technique such as, but not limited to, laser ablation, dry (plasma) etching or wet etching. In an embodiment, the die attach film 816 is patterned in sequence following the laser scribe and plasma etch portions of the singulation process to provide die attach film portions 818, as depicted in FIG. 8C. In an embodiment, the patterned mask 808 is removed after the laser scribe and plasma etch portions of the singulation process, as is also depicted in FIG. 8C. The patterned mask 808 may be removed prior to, during, or following patterning of the die attach film 816. In an embodiment, the semiconductor wafer or substrate 804 is etched while supported by the substrate carrier 814. In an embodiment, the die attach film 816 is also patterned while disposed on the substrate carrier 814. Furthermore, during etch processing, the substrate carrier may be supported by an etch cathode or cooling pedestal or chuck. Upon etch singulation to individual dies, a supporting transfer arm 899 is used for support and possible additional cooling during transfer of the singulated sample to the outside of the etch chamber for die picking.

Accordingly, referring again to Flowchart 700 and FIGS. 8A-8C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In one embodiment, a supporting transfer arm, which may be cooled, is used to transfer the diced product out of the etch chamber. In one same or different embodiment, a cooling pedestal is implemented during the etch portion of the dicing process. In one same or different embodiment, an actively-cooled shadow ring is implemented during the etch portion of the dicing process. Additionally, removal of exposed portions of the die attach film may be performed to provide singulated integrated circuits, each having a portion of a die attach film thereon. The individual integrated circuits, including die attach film portions may then be removed from the substrate carrier 814, e.g., in a die-pick process. In an embodiment, the singulated integrated circuits are removed from the substrate carrier 814 for packaging. In one such embodiment, the patterned die attach film 818 is retained on the backside of each integrated circuit and included in the final packaging. However, in another embodiment, the patterned die attach film 814 is removed during or subsequent to the singulation process.

A single process tool may be configured to perform many or all of the operations in a hybrid laser ablation and plasma etch singulation process. For example, FIG. 9 illustrates a block diagram of a tool layout for laser and plasma dicing of wafers or substrates, in accordance with an embodiment of the present invention.

Figure 9:
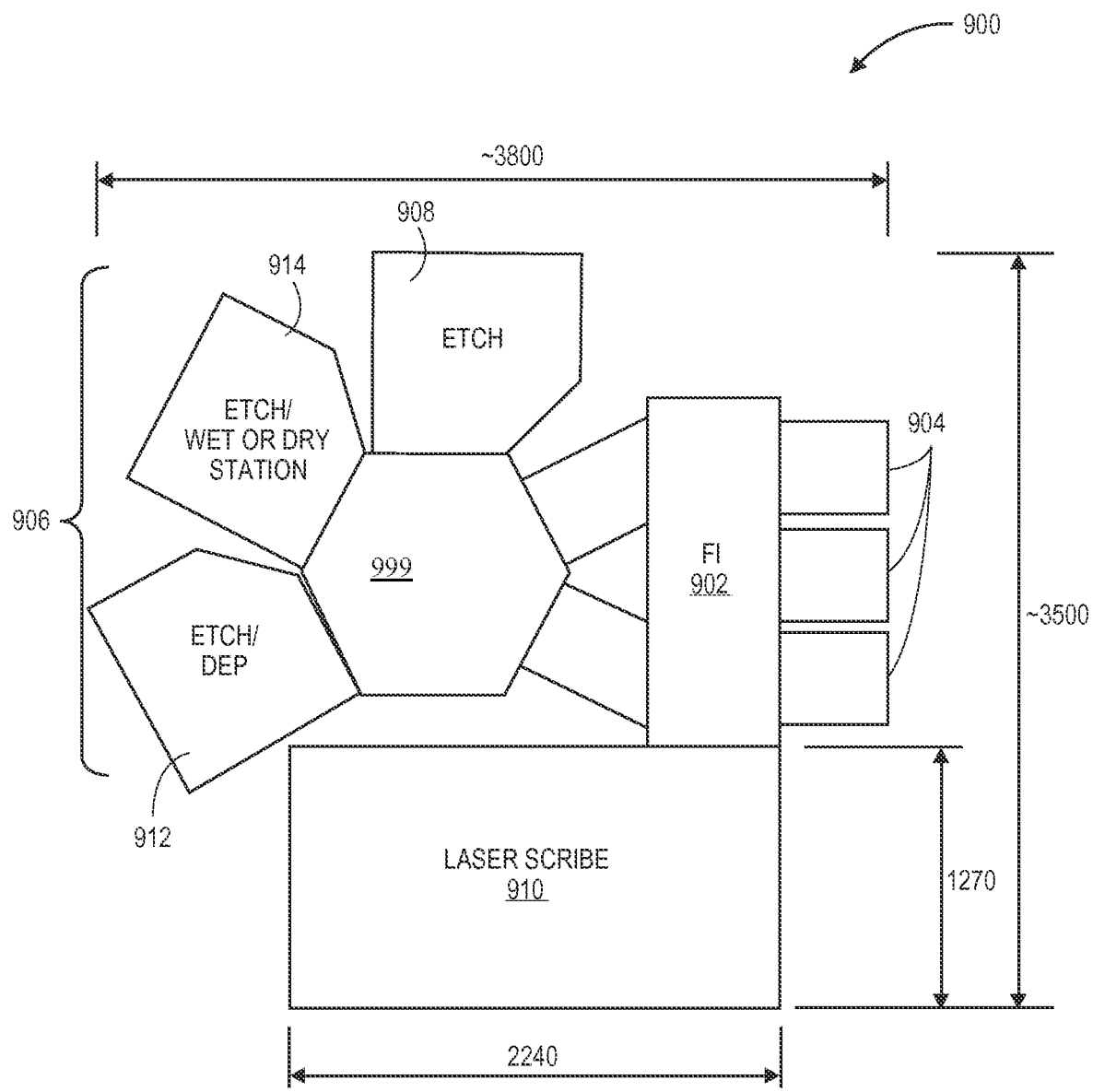
FIG. 9 illustrates a block diagram of a tool layout for laser and plasma dicing of wafers or substrates, in accordance with an embodiment of the present invention.

Referring to FIG. 9, a process tool 900 includes a factory interface 902 (FI) having a plurality of load locks 904 coupled therewith. A cluster tool 906 is coupled with the factory interface 902. The cluster tool 906 includes one or more plasma etch chambers, such as plasma etch chamber 908. A laser scribe apparatus 910 is also coupled to the factory interface 902. The overall footprint of the process tool 900 may be, in one embodiment, approximately 3500 millimeters (3.5 meters) by approximately 3800 millimeters (3.8 meters), as depicted in FIG. 9. The process tool 900 also includes a transfer chamber 999.

In an embodiment, the laser scribe apparatus 910 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 900, the moveable stage configured for moving a wafer or substrate (or a carrier thereof) relative to the femtosecond-based laser. In a specific embodiment, the femtosecond-based laser is also moveable. The overall footprint of the laser scribe apparatus 910 may be, in one embodiment, approximately 2240 millimeters by approximately 1270 millimeters, as depicted in FIG. 9.

In an embodiment, the one or more plasma etch chambers 908 is configured for etching a wafer or substrate through the gaps in a patterned mask to singulate a plurality of integrated circuits. In one such embodiment, the one or more plasma etch chambers 908 is configured to perform a deep silicon etch process. In a specific embodiment, the one or more plasma etch chambers 908 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 908 to facilitate high silicon etch rates. In an embodiment, more than one etch chamber is included in the cluster tool 906 portion of process tool 900 to enable high manufacturing throughput of the singulation or dicing process. In an embodiment, one or more of the etch chambers further includes a cooling pedestal and/or an actively-cooled shadow ring.

In accordance with an embodiment of the present invention, the transfer chamber 999 is equipped with supporting transfer arm. In one embodiment, the transfer arm is for supporting a substantial portion of a dicing tape of a substrate carrier and is configured to transfer a sample from a cathode assembly following an etch singulation process. In one embodiment, the transfer arm is a passively cooled transfer arm (e.g., by first contacting to a cooled chamber wall). In another embodiment, the transfer arm is an actively cooled transfer arm. In a specific such embodiment, the actively cooled transfer arm includes grooves formed in a supporting surface of the transfer arm, the grooves for flowing a cooling gas therein. In another specific such embodiment, the actively cooled transfer arm includes internal channels for flowing a cooling fluid there through.

The factory interface 902 may be a suitable atmospheric port to interface between an outside manufacturing facility with laser scribe apparatus 910 and cluster tool 906. The factory interface 902 may include robots with arms or blades for transferring wafers (or carriers thereof) from storage units (such as front opening unified pods) into either cluster tool 906 or laser scribe apparatus 910, or both.

Cluster tool 906 may include other chambers suitable for performing functions in a method of singulation. For example, in one embodiment, in place of an additional etch chamber, a deposition chamber 912 is included. The deposition chamber 912 may be configured for mask deposition on or above a device layer of a wafer or substrate prior to laser scribing of the wafer or substrate. In one such embodiment, the deposition chamber 912 is suitable for depositing a water soluble mask layer. In another embodiment, in place of an additional etch chamber, a wet/dry station 914 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 900.

In an embodiment, a singulation process is accommodated in a system 900 sized to receive a substrate carrier such as the substrate carrier 100 of FIG. 1A. In one such embodiment, a system such as system 900 can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 1. However, it is to be appreciated that systems may be designed to handle 450 millimeter wafers or substrate or, more particularly, 450 millimeter wafer or substrate carriers.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 900 described in association with FIG. 9 or with etch chamber 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 10:
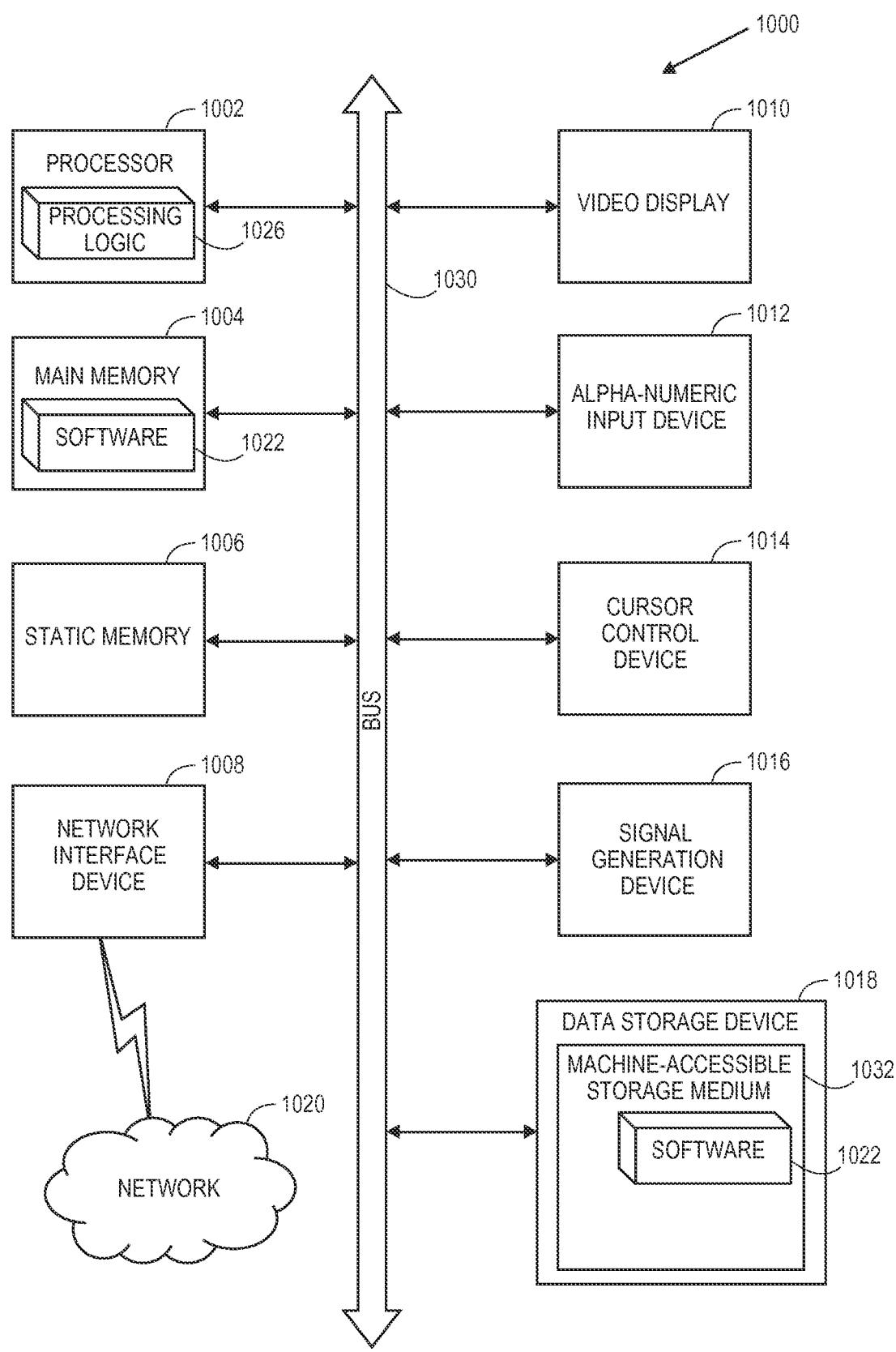
FIG. 10 illustrates a block diagram of an exemplary computer system, in accordance with an embodiment of the present invention.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves providing the semiconductor wafer on a substrate carrier, the substrate carrier having a dicing tape supporting the semiconductor wafer and a tape frame disposed above and surrounding the dicing tape. The method also involves providing a patterned mask above the semiconductor wafer, the patterned mask covering and protecting the integrated circuits and exposing regions of the semiconductor wafer between the integrated circuits. The method also involves transferring the substrate carrier having the semiconductor wafer thereon to a processing region of an etch chamber. The method also involves plasma etching the semiconductor wafer through the gaps in the patterned mask to singulate the integrated circuits. The method also involves transferring the substrate carrier having the singulated integrated circuits thereon from the processing region of the etch chamber using a transfer arm that supports a substantial portion of the dicing tape of the substrate carrier.

Thus, methods of and apparatuses for dicing semiconductor wafers, each wafer having a plurality of integrated circuits, have been disclosed.

What is claimed is:

1. A method of dicing a semiconductor wafer comprising a plurality of integrated circuits, the method comprising:
providing the semiconductor wafer on a substrate carrier, the substrate carrier having a dicing tape supporting the semiconductor wafer and a tape frame disposed above and surrounding the dicing tape, the semiconductor wafer having an outermost perimeter and an area defined by the outermost perimeter;
providing a patterned mask above the semiconductor wafer, the patterned mask covering and protecting the integrated circuits and exposing regions of the semiconductor wafer between the integrated circuits;
transferring the substrate carrier having the semiconductor wafer thereon to a processing region of an etch chamber;
plasma etching the semiconductor wafer through gaps in the patterned mask to singulate the integrated circuits; and
transferring the substrate carrier having the singulated integrated circuits thereon from the processing region of the etch chamber using a transfer arm that supports a substantial portion of the dicing tape of the substrate carrier, the transfer arm having a support portion having a body, wherein the support portion of the transfer arm completely laterally surrounds the substrate carrier, wherein transferring the substrate carrier from the processing region of the etch chamber comprises cooling the dicing tape by actively cooling the transfer arm by flowing a cooling fluid in internal channels of the transfer arm below a region of the dicing tape supported by the transfer arm, and wherein the internal cooling channels are disposed in an area of the body of the support portion of the transfer arm, the area larger than the area of the semiconductor wafer.

2. The method of claim 1, wherein transferring the substrate carrier to the processing region of the etch chamber comprises transferring with the transfer arm.

3. A method of dicing a semiconductor wafer comprising a plurality of integrated circuits, the method comprising:
forming a mask above the semiconductor wafer, the mask comprising a layer covering and protecting the integrated circuits, the semiconductor wafer having an outermost perimeter and an area defined by the outermost perimeter;
patterning the mask with a laser scribing process to provide a patterned mask with gaps, exposing regions of the semiconductor wafer between the integrated circuits;
loading the semiconductor wafer on a substrate carrier, the substrate carrier having a dicing tape supporting the semiconductor wafer and a tape frame disposed above and surrounding the dicing tape;
transferring the substrate carrier having the semiconductor wafer thereon to a processing region of an etch chamber;
plasma etching the semiconductor wafer through the gaps in the patterned mask to singulate the integrated circuits; and
transferring the substrate carrier having the singulated integrated circuits thereon from the processing region of the etch chamber using a transfer arm that supports a substantial portion of the dicing tape of the substrate carrier, the transfer arm having a support portion having a body, wherein the support portion of the transfer arm completely laterally surrounds the substrate carrier, wherein transferring the substrate carrier from the processing region of the etch chamber comprises cooling the dicing tape by actively cooling the transfer arm by flowing a cooling fluid in internal channels of the transfer arm below a region of the dicing tape supported by the transfer arm, and wherein the internal cooling channels are disposed in an area of the body of the support portion of the transfer arm, the area larger than an area of the semiconductor wafer.

4. The method of claim 3, wherein transferring the substrate carrier to the processing region of the etch chamber comprises transferring with the transfer arm.

5. The method of claim 3, wherein patterning the mask with a laser scribing process further comprises forming trenches in the regions of the semiconductor wafer between the integrated circuits, and wherein plasma etching the semiconductor wafer comprises forming trench extensions corresponding to the trenches to singulate the integrated circuits.

* * * * *